US006219234B1

United States Patent
Sammakia et al.

(10) Patent No.: US 6,219,234 B1
(45) Date of Patent: Apr. 17, 2001

(54) METHOD FOR USING PULSATING FLOW TO IMPROVE THERMAL TRANSPORT IN SYSTEMS

(75) Inventors: Bahgat G. Sammakia, Newark Valley; Sanjeev B. Sathe, Binghamton, both of NY (US)

(73) Assignee: International Business Corporation, Armonk, NY (US)

( * ) Notice: Subject to any disclaimer, the term of this patent is extended or adjusted under 35 U.S.C. 154(b) by 0 days.

(21) Appl. No.: 09/281,703

(22) Filed: Mar. 30, 1999

(51) Int. Cl.$^7$ .............................. H05K 7/20; F01D 17/18

(52) U.S. Cl. .......................... 361/695; 415/150; 415/151; 416/247 R

(58) Field of Search ..................................... 165/121–122; 361/690–695; 415/150–151, 182.1, 208.1, 211.92; 416/247 R

(56) References Cited

U.S. PATENT DOCUMENTS

| 4,144,932 | * | 3/1979 | Voigt ................................... 165/122 |
| 5,131,810 | | 7/1992 | Wang . |
| 5,335,143 | | 8/1994 | Maling, Jr. et al. . |
| 5,458,458 | | 10/1995 | Tada et al. . |

OTHER PUBLICATIONS

Kim et al, "Thermal Interaction Between Isolated Heated Electronic Components in Pulsating Channel Flow," Numerical Heat Transfer, Part A: Application, vol. 34, No. 1, pp. 1–18, Jul., 1998.

* cited by examiner

*Primary Examiner*—Gregory Thompson
(74) *Attorney, Agent, or Firm*—Schmeiser, Olsen & Watts; Lawrence R. Fraley

(57) ABSTRACT

A method for forming a pulsating air pattern at a surface of an electronic carrier assembly. The electronic carrier assembly includes a circuit card having an attached module or chip. An air circulation pattern, or flow pattern, is formed at the surface of an electronic carrier assembly by natural convection, or by a steady air flow generated by a fan, respectively. A suitably-positioned rotatable disk having one or more void regions, and in a state of rotation, interrupts the air circulation or flow pattern by causing a pulsation air pattern at the surface of the electronic carrier assembly. The effect of the pulsating air pattern is to increase the rate of heat transfer from the electronic carrier assembly by two mechanisms. First, the thickness of the boundary layer at the surface of the electronic carrier is reduced, thereby increasing the heat transfer coefficient at the boundary layer. Second, stagnant air trapped between nearby electronic components on the electronic carrier assembly is swept away. When no fan is present, the method generates a pulsating air pattern that enhances natural convection heat transfer. When a fan is present, the disk may be positioned between the fan and the electronic carrier assembly. Alternatively, the electronic carrier assembly may be positioned between the fan and the disk. Other configurations are possible, including those having two fans, two disks, and two or more electronic carrier assemblies.

26 Claims, 12 Drawing Sheets

METHOD FOR USING PULSATING FLOW TO IMPROVE THERMAL TRANSPORT IN SYSTEMS

BACKGROUND OF THE INVENTION

1. Technical Field

The present invention relates to a method for forming a pulsating air pattern at a surface of an electronic carrier assembly.

2. Related Art

An electronic carrier assembly comprises an electronic carrier, such as a circuit board, having an attached electronic component such as a module or a chip. When electric current flows within an electronic carrier assembly, heat is generated and the heat must be dissipated. Natural convection provides an effective mechanism for heat removal where the required rate of heat removal is small. For situations in which the required rate of heat removal is large, a cooling fan is typically used, since a fan generates an air flow across a surface of an electronic carrier assembly which removes heat by forced convection. The heat transfer coefficient associated with forced convection, which is generally higher than the heat transfer coefficient associated with natural convection, increases as the velocity of air flow increases. A surface of an electronic carrier assembly includes the surface of the electronic carrier and the surfaces of electronic components attached to the electronic carrier. Under this definition, a surface of an electronic carrier assembly includes surfaces from which heat may be transferred from the electronic carrier assembly to the surrounding air, or other surrounding fluid.

The required rate of heat removal increases with increasing current flow, which is a consequence of increasing power input. The required rate of heat removal is generally higher in a closed system than in an open system. Under the assumption that the electronic carrier assembly is coupled to a housing, a closed system is a configuration in which one or more housing surfaces are located so as to impede air flow normal to the surfaces of the electronic carrier assembly. With an open system, housing surfaces do not impede air flow normal the surfaces of the electronic carrier assembly. Accordingly, an open system allows better heat transfer from an electronic carrier assembly than does a closed system when the primary mode of heat transfer is natural convection, especially when the electronic carrier assembly is oriented vertically. With forced convection and adequate venting, a closed system is the more efficient system for dissipating heat, because the housing enhances the air flow velocity at the surface of the electronic carrier assembly. A disadvantage of a closed system with forced convection heat transfer, however, is a generation of higher pressure drops, which in turn raises the level of acoustic noise. Another applicable system is a partially open system in which housing surfaces are located so as to impede air flow normal from one surface of the electronic carrier assembly, but not from another surface of the electronic carrier assembly.

While present systems remove heat from operating electronic carrier assemblies, it would be advantageous to remove such heat removal more efficiently. It would also be advantageous to remove heat from an electronic carrier assembly by natural convection where a cooling fan would otherwise be required.

SUMMARY OF THE INVENTION

The present invention provides a method for forming a pulsating air pattern at a surface of an electronic carrier assembly, comprising: providing a rotatable disk; and rotating the rotatable disk to form the pulsating air pattern at the surface of the electronic carrier assembly.

The present invention provides an electrical structure, comprising: an electronic carrier assembly; a rotatable disk; and a system for rotating the rotatable disk, to form a pulsating air pattern at a surface of the electronic carrier assembly.

The present invention has the advantage of improving the transfer of heat from an operating electronic carrier assembly for cases when a fan is present, and also for cases in which no fan is present.

The present invention has the advantage of being inexpensive to implement.

The present invention has the advantage of consuming low power, since the primary power required over that of existing systems is the power input to the slowly rotating disk.

The present invention has the advantage of having modest space requirements, since the rotatable disk may be thin and is positioned at a side of the electronic carrier assembly where there typically is available space.

The present invention has the advantage of ease of retrofitting the disk to existing electronic configurations.

The present invention has the advantage of being easily reworkable, since reworking merely requires removing the rotatable disk.

The present invention has the advantage of enabling some electronic configurations to have heat removed by natural convection where a cooling fan would otherwise be required.

DETAILED DESCRIPTION OF THE INVENTION

Figure 1:
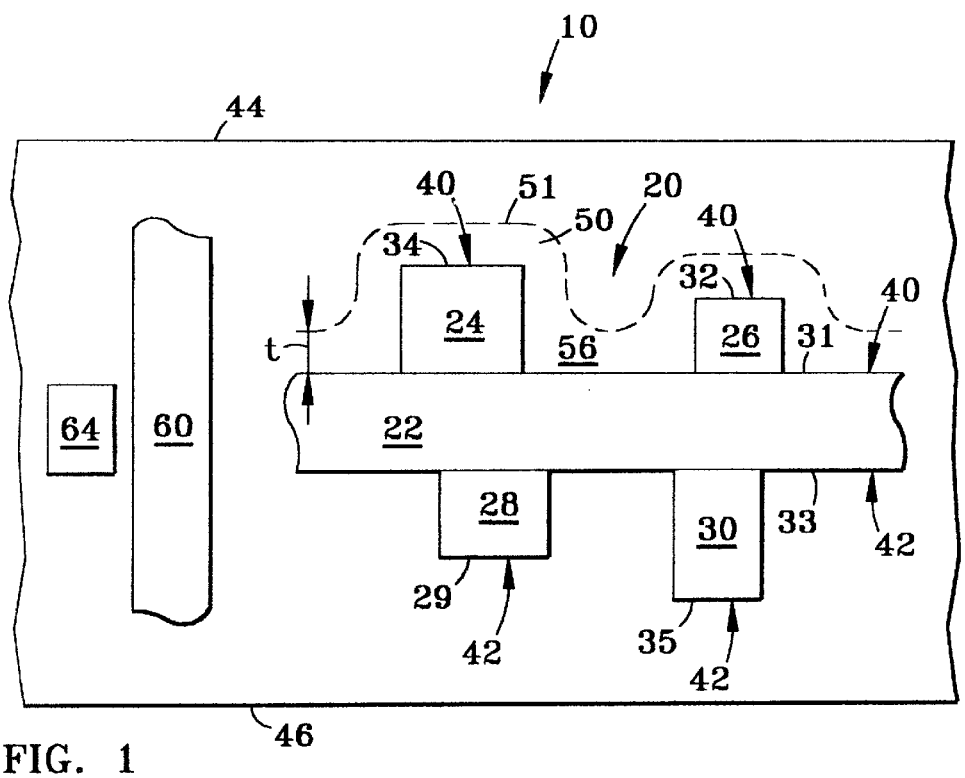
FIG. 1 depicts a front view of an electrical structure, in accordance with a preferred embodiment of the present invention.

FIG. 1 illustrates a front view of an electrical structure 10, oriented horizontally, of a preferred embodiment of the present invention. The electrical structure 10 includes an electronic carrier assembly 20 and a rotatable disk 60. The electrical structure 10 may also include a housing. If present, the housing may include an upper housing surface 44 or a lower housing surface 46, or both. The electronic carrier assembly 20 includes an electronic carrier 22 having a top surface 31 and a bottom surface 33, an electronic component 24 having a surface 34, an electronic component 26 having a surface 32, an electronic component 28 having a surface 29, and an electronic component 30 having a surface 35. The electronic carrier 22 may be any type of electronic carrier, such as a circuit board. Any type of electronic component may be represented by electronic components 24, 26, 28, and 30, such as a module or a chip. The top surface 40 of the electronic carrier assembly 20 includes the top surface 31 of the electronic carrier 22, the surface 34 of the electronic component 24, and the surface 32 of the electronic component 26. The bottom surface 42 of the electronic carrier assembly 20 includes the bottom surface 33 of the electronic carrier 22, the surface 29 of the electronic component 28, and the surface 35 of the electronic component 30. Although components 24 and 26 are shown coupled to top surface 31 of the electronic carrier 22, and bottom components 28 and 30 are shown as coupled to bottom surface 33 of the electronic carrier 22, it should be noted that electronic components may be coupled only to the top surface 31 of the electronic carrier 22 or coupled only to the bottom surface 33 of the electronic carrier 22. Any number, including zero, of electronic components may be coupled to each of surfaces 31 and 33 of the electronic carrier 22.

A system 64 for rotating the disk 60 may include any device, medium, or mechanism, such as an electric motor or a flowing air current, that can cause the disk 60 to rotate. The system 64 may, or may not, be mechanically coupled to the disk 60. Although various rotatable disks in FIGS. 2–26 are shown without a system for rotating the various rotatable disks, it should be understood that a system is nevertheless present for rotating the various rotatable disks.

Figure 2:
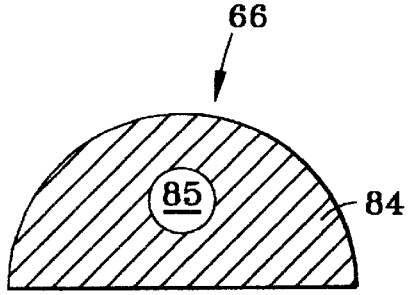
FIG. 2 depicts the disk in the electrical structure in of FIG. 1, as including a solid sector having a hole.

The disk 60 in FIG. 1 includes many possible configurations, including those shown in FIGS. 2, 3, 4, and 5. FIG. 2 illustrates a rotatable disk 66, as illustrative of the disk 60 of FIG. 1, having at a solid sector 84 that has a hole 85. Although the angular size of the solid sector 84 is shown as about 180 degrees, the angular sector size of the solid sector 84 may be less than 180 degrees or greater than 180 degrees. The hole 85 may have any shape, such as a circular, square, or elliptical shape. The hole 85 may have any size and be positioned anywhere on the solid sector 84. The hole 85 may be omitted or alternatively represent one of a plurality of holes within the solid sector 84.

Figure 3:
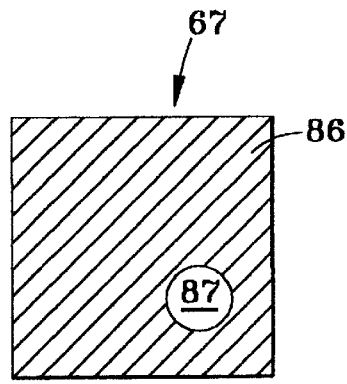
FIG. 3 depicts the disk in the electrical structure of FIG. 1, as including a solid polygon having hole.

FIG. 3 illustrates a rotatable disk 67, as illustrative of the disk 60 of FIG. 1, including a solid polygon 86 that has a hole 87 of any cross sectional area less than the surface area of the solid polygon 86. The hole 87 may have any shape, such as a circular, square, or elliptical shape. The hole 87 may have any size and may be positioned anywhere on the solid polygon 86. The hole 87 is shown as one hole, but may alternatively represent one of a plurality of holes within the solid polygon 86. The solid polygon 86 is shown as a square disk, but may have the shape of any polygon of at least 3 sides. The rotatable disk 67 may also approximate a circular disk that has a hole. Where the solid polygon 86 is a regular polygon of n sides, the solid polygon 86 approaches a circle as n approaches infinity. The rotatable disk 67 may also approximate a solid rectangular disk. Where the solid polygon 86 is a rectangle, the solid polygon 86 approaches a solid rectangular disk as the cross sectional area of the hole 87 approaches zero.

Figure 4:
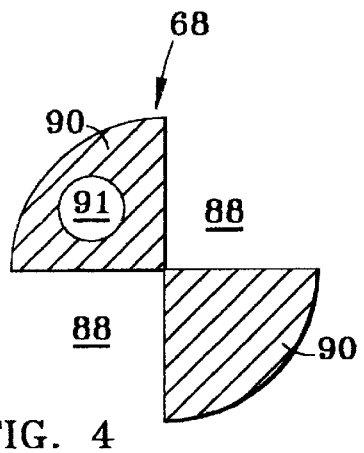
FIG. 4 depicts the disk in the electrical structure of FIG. 1, as including alternating solid sectors.

FIG. 4 illustrates a rotatable disk 68, as illustrative of the disk 60 of FIG. 1, including a plurality of solid sectors 90 in an alternating pattern with void sectors 88. Each pair of consecutive solid sectors 90 bounds a void sector 88. Each solid sector of the plurality of solid sectors 90 may have any angular size such that the sum of the angular sizes of the solid sectors 90 and the void sectors 88 is 360 degrees. Each solid sector of the plurality of solid sectors 90 may alternatively and independently include a hole 91 having any of the characteristics of the hole 85 of FIG. 2.

The preceding examples in FIGS. 2–5 are mere illustrations of the numerous possible configurations of the rotatable disk 60 of FIG. 1. It should be noted that the thickness of the rotatable disk 60 need not be constant and may therefore vary with spatial location on a surface of the rotatable disk 60.

Figure 5:
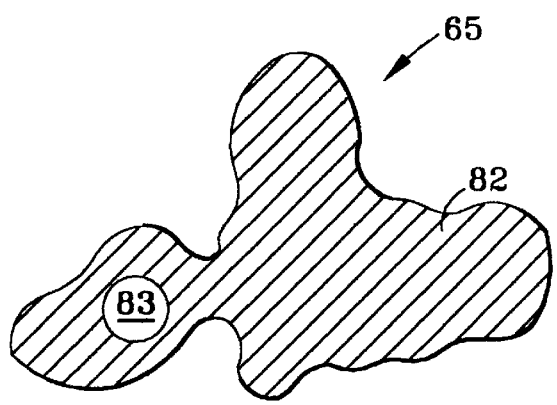
FIG. 5 depicts the disk in the electrical structure in FIG. 1, as including an irregular shape.

The rotatable disk 60 of FIG. 1 may include any shape, such as the irregular shape 82 of the rotatable disk 65 in FIG. 5. The hole 83 within the irregular shape 82 may have any of the characteristics of the hole 85 of FIG. 2. Alternatively, the hole 83 may be omitted or represent one of a plurality of holes within the irregular shape 82.

The rotatable disk 60, as illustrated by the examples in FIGS. 2–5, serves to introduce a pulsating disturbance in the air circulation pattern in the vicinity of the electronic carrier assembly 20, for the purpose of increasing the rate of heat dissipation from the electronic carrier assembly 20. To be consistent with this purpose, the rotatable disk 60 should have sufficient void area so as not to duly impede hot air from flowing through or around the disk 60. Thus, a solid circular disk with a tiny pinhole, such that the disk occupies most or all of the flow area on a side of the electronic carrier assembly 20, might decrease, rather than an increase, the rate of heat transfer from the electronic carrier assembly 20. In contrast, a solid disk having holes with sufficient void area for circulation purposes is a candidate for enhancing the rate of heat transfer. The required or optimum void area associated with the disk 60 depends on several factors, including the geometry of the electrical structure 10 (surface geometry of the electronic carrier assembly 20, housing geometry, etc.) and the heat dissipation requirements for a given application.

Returning to FIG. 1, power input to the electronic carrier assembly 20 generates heat in electronic components 24, 26, 28, and 30, resulting in a natural convection boundary layer 50, defined by bounding surface 51. Thus the boundary layer 50 is along the top surface 40 of the electronic carrier assembly 20. The boundary layer 50 at the top surface 40 is characterized by a thickness t. The boundary layer thickness t may vary with location on the top surface 40 of the electronic carrier assembly 20, depending on a variety of factors including local geometric characteristics of the top surface 40 and local rates of heat generation along the top surface 40. There is a corresponding boundary layer (not shown) associated with the bottom surface 42 of the electronic carrier assembly 20. The thickness t of the boundary layer 50 impacts the rate of heat dissipation from the top surface 40 of the electronic carrier assembly 20, since the rate of heat dissipation increases as the boundary layer thickness t decreases. Heat dissipation is degraded by trapped air in the stagnation zone 56. A stagnation zone is, generally, the space between two successive electronic components. In FIG. 1, the stagnation zone 56 is the space between successive electronic components 24 and 26.

Figure 6:
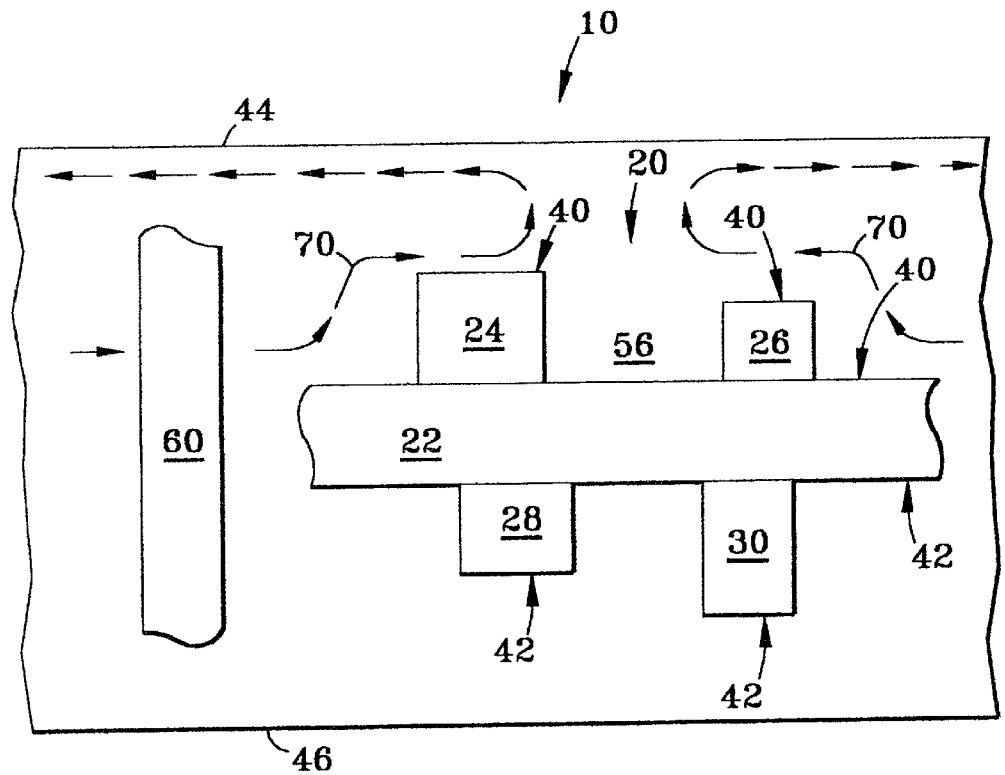
FIG. 6 depicts the electrical structure of FIG. 1, with an illustration of the air flow pattern.

FIG. 6 illustrates the electrical structure of FIG. 1 with an air circulation pattern 70 at a given instant of time when power is supplied to the electronic structure 10. The rotatable disk 60 may be rotated at a frequency $f_d$, by use of any suitable powering device such as an electric motor. When rotated, the disk 60 causes the air circulation pattern 70 to oscillate in time at a frequency equal to fd or at a harmonic thereof for the disk configuration of FIG. 3. If the disk of FIG. 3 contains N equal-sized alternating solid sectors, the natural convection air circulation pattern 70 will pulsate at a frequency of $Nf_d$. The pulsation reduces the boundary layer thickness t shown in FIG. 1, which increases the rate of heat dissipation. It is possible that stagnant air may not be removed from the stagnation zone 56 (see supra discussion of FIG. 1 for a definition of a stagnation zone) by the pulsation, because the air circulation pattern 70 lacks a steady flow component that would assist the pulsation in sweeping away the stagnant air in the stagnation zone 56. Thus, the use of a rotating disk to improve natural circulation heat transfer is most useful in applications where natural circulation alone is inadequate and where the improvement in heat transfer by the rotating disk avoids more costly and complicated heat removal methods, such as forced convection. Note that heat is transferred less effectively from the bottom surface 42 of the electronic carrier assembly 20 than from the top surface 40 of the electronic carrier assembly 20, because of the tendency of hot air to rise toward the bottom surface 42 and away from the top surface 40.

Figure 7:
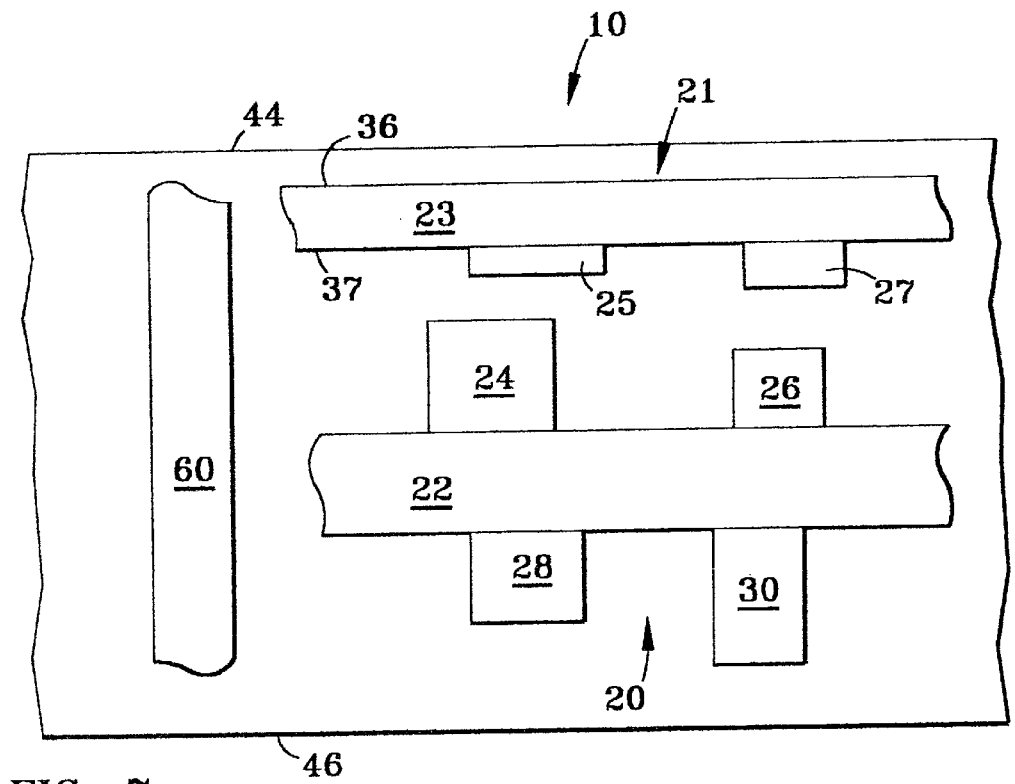
FIG. 7 depicts the electrical structure of FIG. 1, with a second electronic carrier assembly.

FIG. 7 illustrates the electrical structure of FIG. 1 with a second electronic carrier assembly 21, which includes an electronic carrier 23 having a top surface 36, a bottom surface 37, and electronic components 25 and 27. Although not shown, electronic components may be coupled to the top surface 36, with or without electronic components coupled to the bottom surface 37. Although FIG. 7 shows only two electronic carrier assemblies, namely 20 and 21, the electrical structure 10 may include any number of electronic carrier assemblies.

Figure 8:
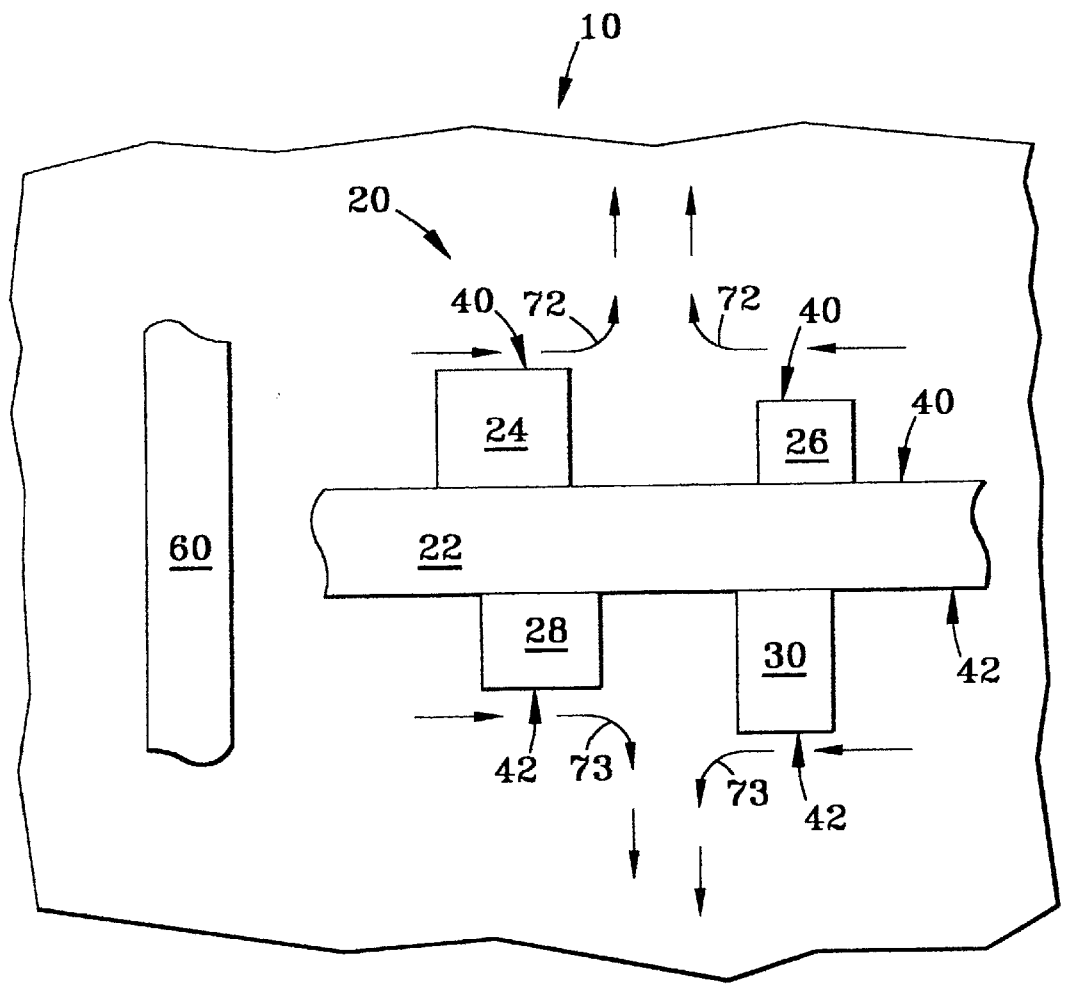
FIG. 8 depicts an open-system variant of the electrical structure of FIG. 1.

The magnitude of the heat transfer improvement by use of the rotating disk 60 in FIG. 1 depends on factors such as geometry and availability of open space for air circulation. FIG. 8 illustrates the electrical structure 10 of FIG. 1 with the upper housing surface 44 removed and the lower housing surface 46 removed. The configuration of FIG. 8, with a representative air circulation patterns 72 and 73, is an example of an open system, allowing more space for air circulation than does the closed system of FIG. 1. A consequence of the increased space for air circulation is an increase in the rate of heat transfer from the electronic carrier assembly 20.

Figure 9:
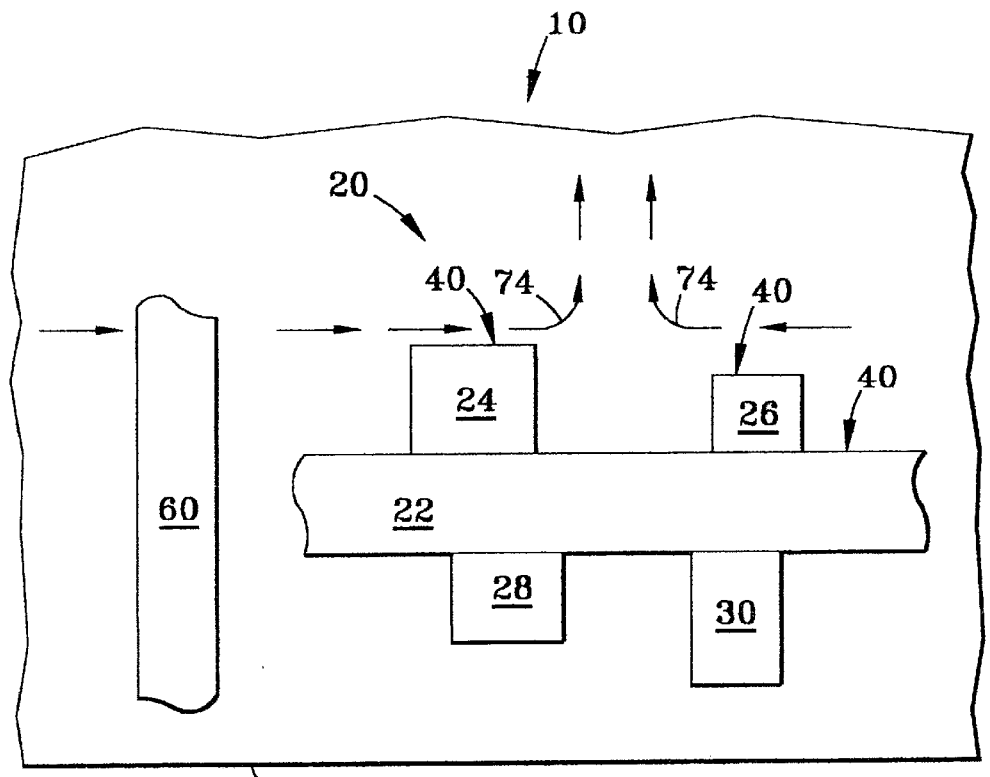
FIG. 9 depicts a partially open-system variant of the electrical structure of FIG. 1.

FIG. 9 illustrates the electrical structure 10 of FIG. 1 with the upper housing surface 44 removed. The configuration of FIG. 9, with a representative air circulation pattern 74 in the vicinity of top surface 40 of the electronic carrier assembly 20, is an example of a partially open system, allowing more space for air circulation than does the closed system of FIG. 1. A consequence of the increased space for air circulation in FIG. 9 is an increase in the rate of heat transfer from the top surface 40 of the electronic carrier assembly 20, as compared the corresponding heat transfer rate in FIG. 1.

Figure 10:
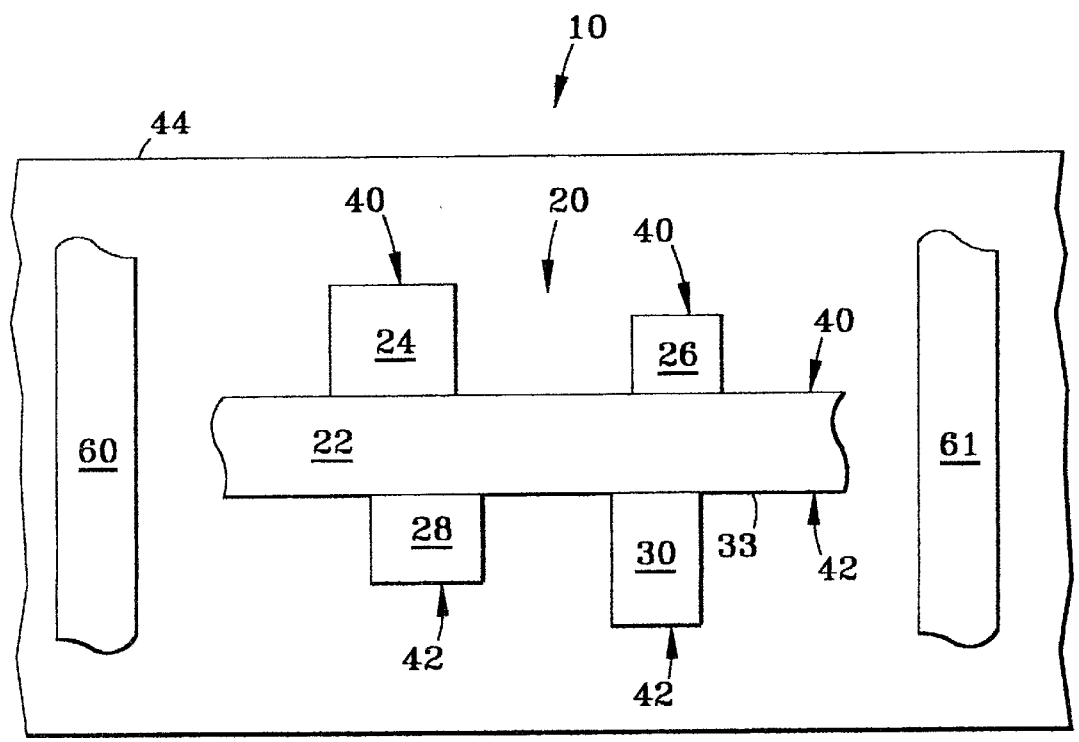
FIG. 10 depicts the electrical structure of FIG. 1, with a second rotatable disk.

FIG. 10 illustrates the electrical structure 10 of FIG. 1 with a second rotatable disk 61. The electronic carrier assembly 20 is interposed between the disk 60 and the second rotatable disk 61. The second rotatable disk 61 has any of the features available to the disk 60. The second rotatable disk 61 is not necessarily the same as the disk 60 for a given electrical structure 10. For example, the disk 60 may include one solid sector having an angular extent of 120 degrees, while the second rotatable disk 61 may include a solid octagon having 10 randomly spaced holes. With the disk 60 alone in operation, the pulsating air circulation pattern diminishes in intensity with increasing horizontal distance from the disk 60. The second rotatable disk 61 serves to enhance the pulsating air circulation pattern in the most distant locations from the disk 60, so as to maximize the overall improvement in heat transfer from the entire top and bottom surfaces, 40 and 42 respectively, of the electronic carrier assembly 20.

Figure 11:
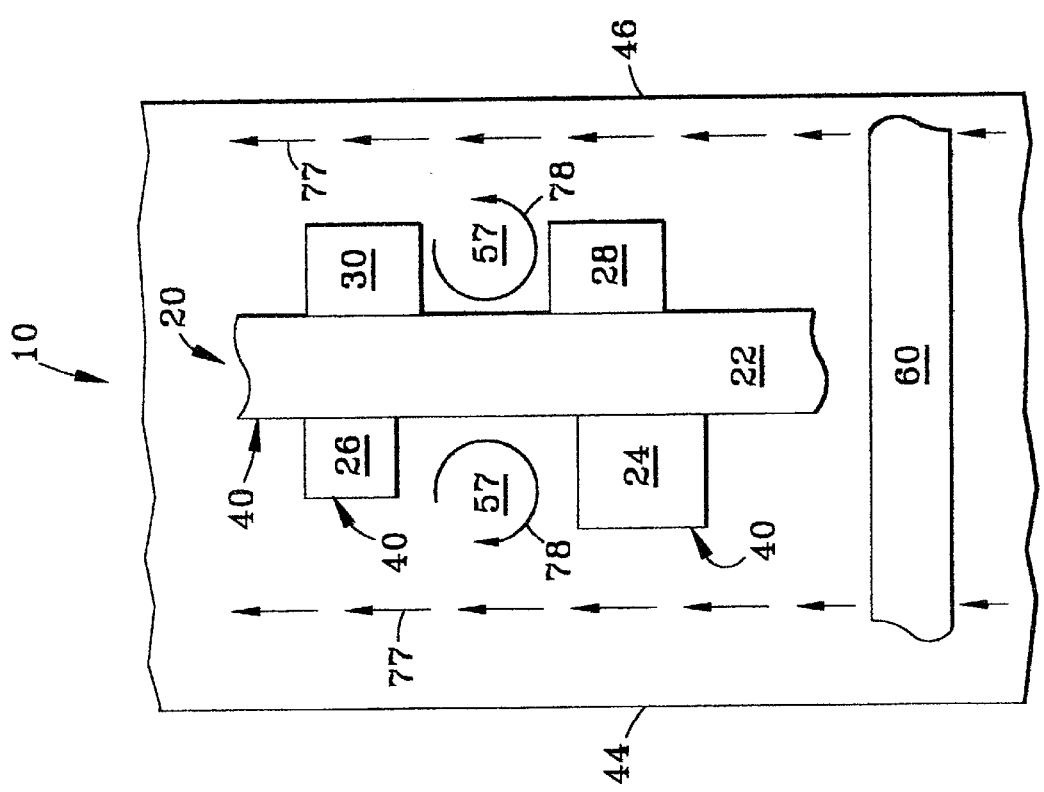
FIG. 11 depicts the electrical structure of FIG. 1, oriented vertically.

FIG. 11 illustrates the electrical structure 10 of FIG. 1 rotated 90 degrees, so as to orient the electrical structure 10 in a vertical direction. With the vertical orientation, the natural convection air circulation pattern 77 has a steady upward component due to a thermally-induced air-density gradient in the downward direction. When rotated at a frequency $f_d$, the disk 60 induces a pulsating air circulation component of frequency $f_d$, or of $Nf_d$ for positive integers N if the disk includes N alternating equal-sized solid sectors (see discussion associated with FIG. 6 supra concerning generation of harmonics of $f_d$ in the pulsating flow pattern). As explained for FIG. 6, the pulsating the air circulation pattern 77 in FIG. 11 reduces the boundary layer thickness along the top surface 40 of the electronic carrier 20, which in turn increases the rate of heat dissipation from the top surface 40 of the electronic carrier 20. Additionally, the steady upward air flow component of the air circulation pattern 77, combined with the pulsating flow component indued by rotation of the disk 60, facilitates local air circulation 78 that sweeps stagnant air out of the stagnation zones 57. Thus, the vertical orientation improves heat transfer by both reducing the boundary layer thickness and convecting stagnant air out of stagnation zones. As a result, the rotating disk is potentially more effective in dissipating heat in the vertical orientation than in the horizontal orientation for a given electrical structure 10. It should be noted that the electrical structure 10 may be oriented horizontally, vertically, or at any angle with respect to the horizontal direction.

Figure 12:
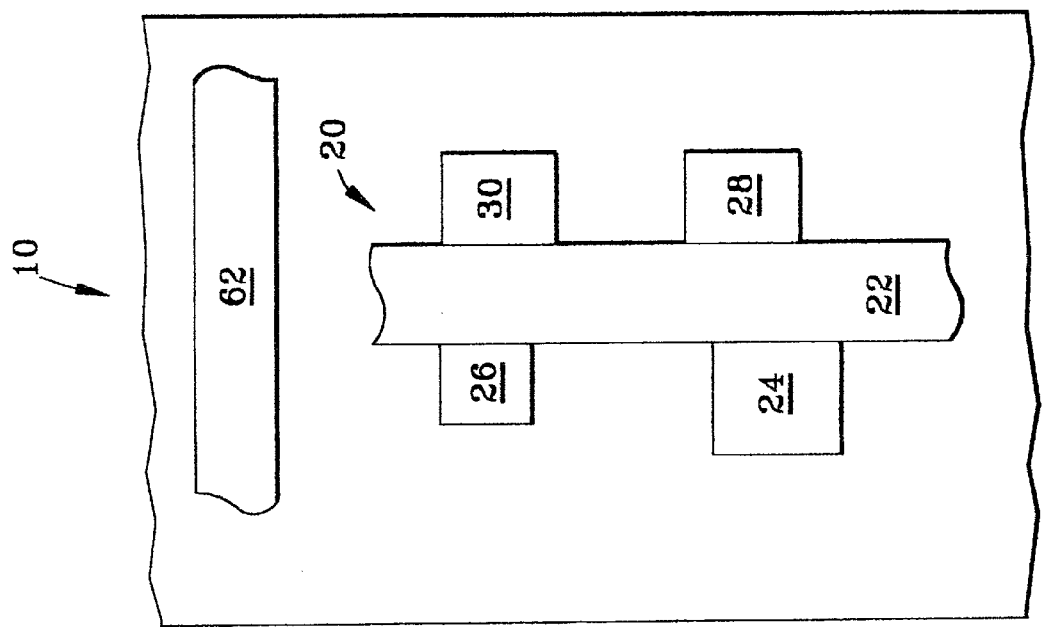
FIG. 12 depicts the electrical structure of FIG. 11, with the disk repositioned.

FIG. 12 illustrates the electrical structure of FIG. 11 with the disk 62 representing the disk 60 of FIG. 11 after the disk 62 is positioned above the electronic carrier assembly 20. The configuration of FIG. 12, while effective to some extent, may not be as effective as the configuration of FIG. 11 in improving heat transfer, because the disk 62 in FIG. 12 interacts with the steady vertical flow after the flow passes the electronic carrier assembly 20, while the disk 60 in FIG. 11 interacts with the steady vertical flow before the flow passes the electronic carrier 22.

Figure 13:
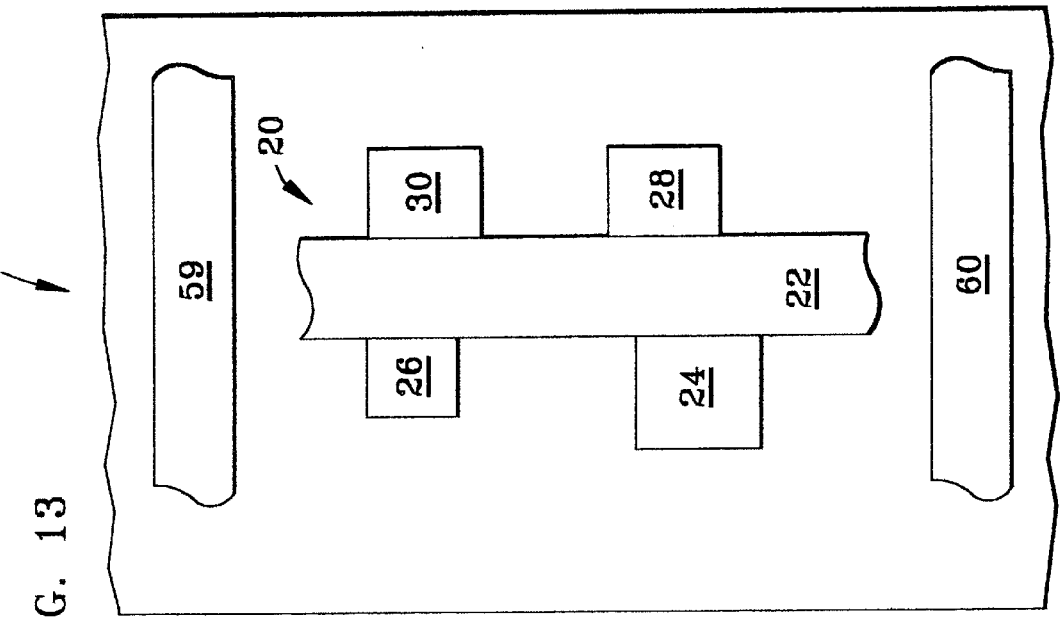
FIG. 13 depicts the electrical structure of FIG. 11, with a second rotatable disk.

FIG. 13 illustrates the electrical structure of FIG. 1 with a second rotatable disk 59 at a location above the electronic carrier assembly 20. The electronic carrier assembly 20 is interposed between the disk 60 and the second rotatable disk 59. The second rotatable disk 59 has any of the features available to the disk 60.

Figure 14:
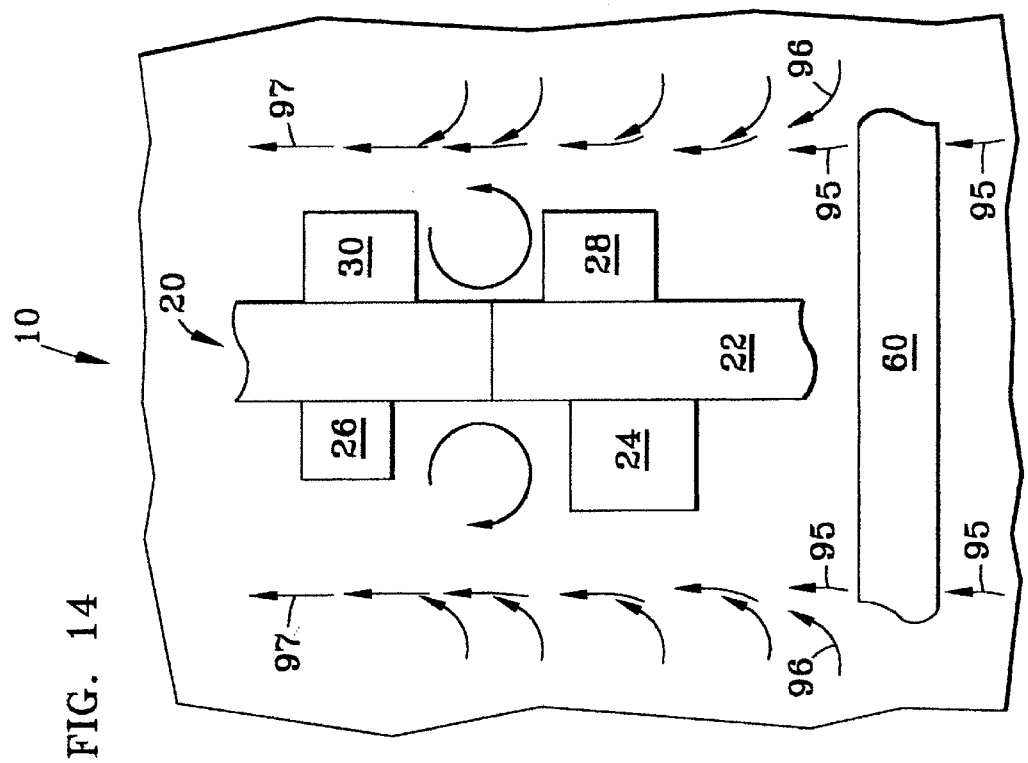
FIG. 14 depicts an open-system variant of the electrical structure of FIG. 11.

FIG. 14 illustrates FIG. 11 after removal of housing surfaces 44 and 46, which were respectively referred to supra in the horizontally-oriented configuration of FIG. 1 as upper housing surface 44 and lower housing surface 46. Thus, FIG. 14 constitutes an open system in which the upward-flowing air circulation pattern 97 due to natural convection is the result of combining the bottom air pattern 95 with the peripheral air pattern 96.

Figure 15:
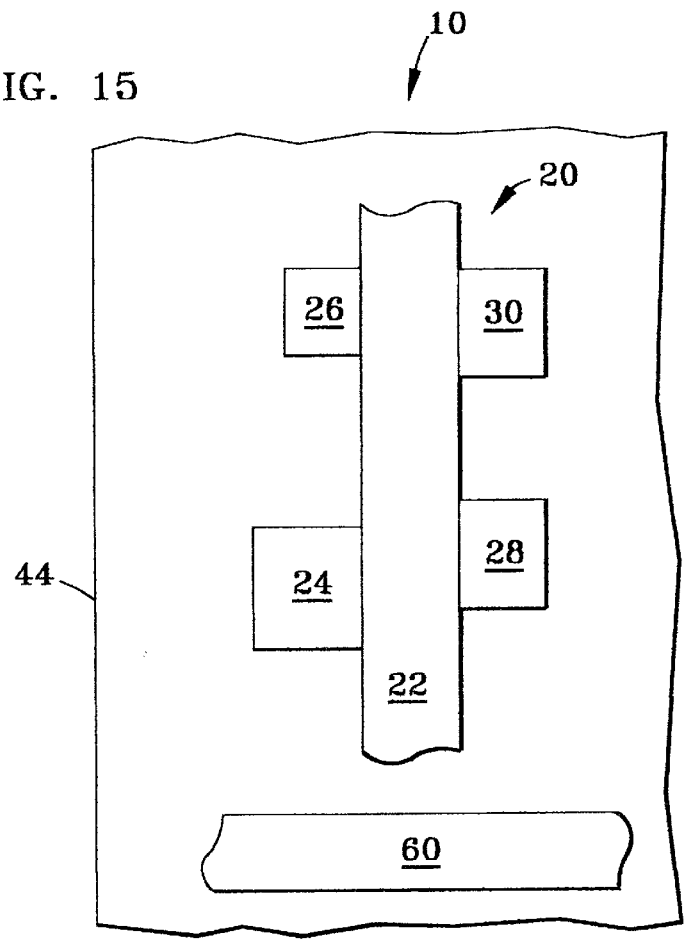
FIG. 15 depicts a partial open-system variant of the electrical structure of FIG.

FIG. 15 illustrates FIG. 11 after removal of housing surface 46, resulting in a partially open system having housing surface 44. As a consequence, the electrical structure 10 in FIG. 15 includes an air circulation pattern similar to that in FIG. 11 between the housing surface 44 and the electronic carrier assembly 20, and an air circulation pattern similar to that in FIG. 14 on the open side (i.e., side lacking a housing surface) of the electronic carrier assembly 20.

Figure 16:
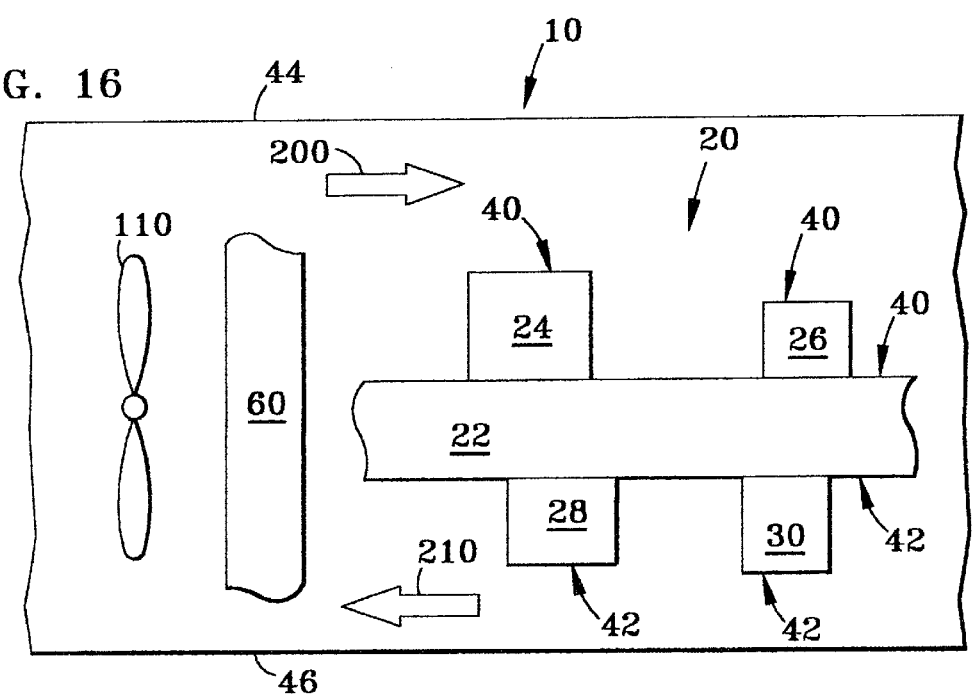
FIG. 16 depicts the electrical structure of FIG. 1, with a fan.
Figure 26:
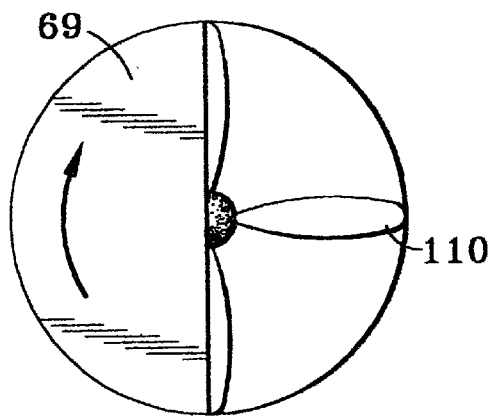
FIG. 26 depicts a fan and a semicircular cover.

FIG. 16 illustrates FIG. 1 with the addition of a fan 110. The disk 60 is interposed between the fan 110 and the electronic carrier assembly 20. An operating fan forms a steady flow component of air circulation along a surface, such as top surface 40 of the electronic carrier assembly 20, while operating at an operating frequency. Any type of fan may be used, including a conventional fan that has a rotatable curved blade that rotates at the fan operating frequency. The fan operating frequency may be greater than, equal to, or less than the disk rotational frequency $f_d$. For some applications, it may be preferred to have the fan operating frequency substantially exceed $f_d$, such as by at least about an order of magnitude, since a low-frequency pulsation may provide an acceptable improvement in the rate of heat dissipation from the electronic carrier assembly 20. The disk 60 may exist as mechanically separated from the fan 110, or may be physically attached to the fan 110. An example of the latter situation is where the disk 60 serves as a cover for the fan 110, as illustrated in FIG. 26. FIG. 26 shows a semicircular rotatable disk 69 as a cover to the fan 110. The fan 110 may be either a push-type pan or a pull-type fan. A push-type fan pushes air along the top surface 40 and bottom surface 42 of the electronic carrier assembly 20, by directing the flow of air from the fan 110 toward the electronic carrier assembly 20 in the direction 200. A pull-type fan pulls air along the top surface 40 and bottom surface 42 of the electronic carrier assembly 20, by directing the flow of air toward the fan in the direction 210.

Although the fan 110 is used in FIG. 16, any device capable of generating a steady air flow may be used. For example, a device that establishes and maintains a pressure gradient, such as a pump in a closed loop, is capable of generating a steady air flow.

Although FIG. 16 shows a horizontally-oriented configuration, the electrical structure 10 of FIG. 16 will operate similarly in any angular orientation, because the theory of operation is based on forced convection. With forced convection, gravitational effects are negligible. In contrast, gravitational effects control natural convection such that air circulation is significantly different for the horizontal and vertical orientations of the electrical structure 10, as explained supra in the discussion of FIG. 11. Since each configuration in FIGS. 16–25, to be discussed infra, includes at least one fan, forced convection dominates the configurations of FIGS. 16–25. Thus, the flow patterns in each of FIGS. 16–25 are insensitive to the angular orientation of the electrical structure 10.

Figure 17:
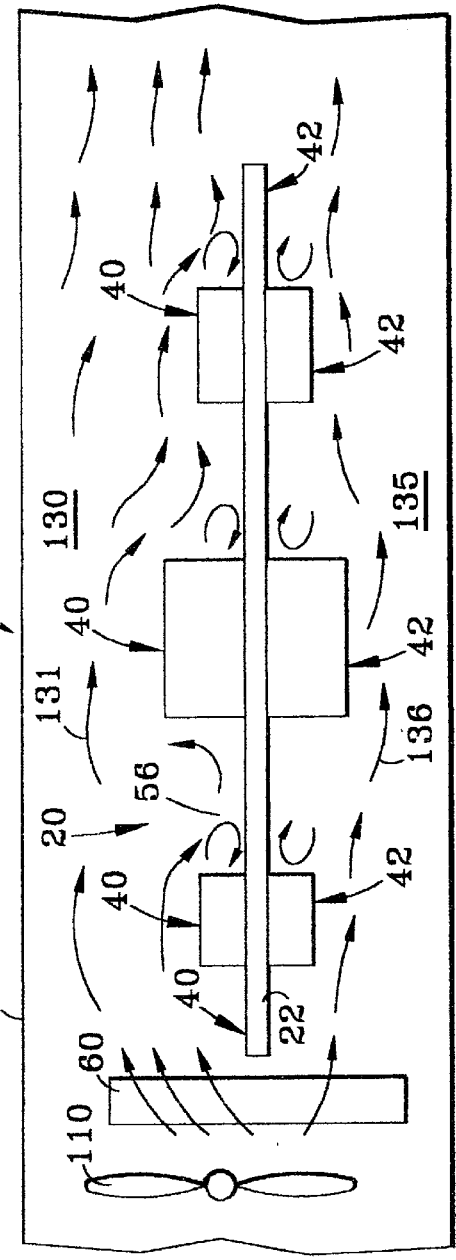
FIG. 17 depicts FIG. 16 with a change of electronic components, showing an air flow pattern at a first time in the cycle of fan rotation.
Figure 18:
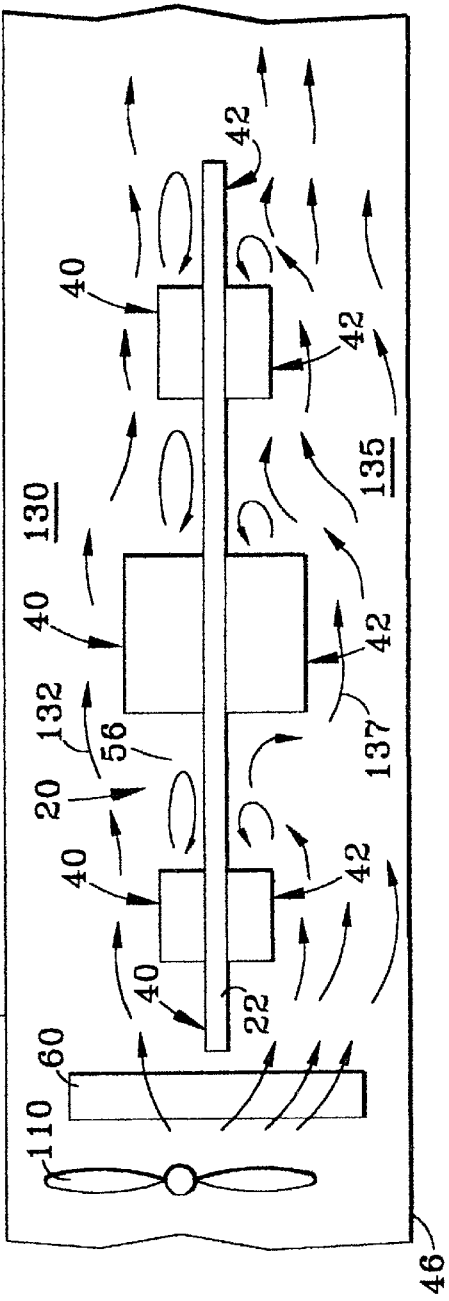
FIG. 18 depicts FIG. 16 with a change of electronic components, showing an air flow pattern at a second time in the cycle of fan rotation.

FIGS. 17 and 18 illustrate the air flow patterns of FIG. 16 at two different times in the cycle of fan rotation. The hardware configuration of FIGS. 17 and 18 is essentially the same as that of FIG. 16 with the exception of a different arrangement of electronic components on the electronic carrier 22. FIG. 17 shows a stronger air flow pattern 131 in the upper half 130 of the electronic structure 10 than the relatively weaker air flow pattern 136 in the lower half 135 of the electronic structure 10. FIG. 18, which provides a snapshot at a different time in the cycle of fan rotation from that of FIG. 17, shows a weaker air flow pattern 132 in the upper half 130 of the electronic structure 10 than the relatively stronger air flow pattern 137 in the lower half 135 of the electronic structure 10. The difference in flow patterns in FIGS. 17 and 18 is due to the difference in locations of the solid portion(s) of the disk 60 at the different snapshot times associated with FIGS. 17 and 18. With the steady flow of air generated by the operating fan 110, combined with the pulsating air pattern induced by the rotating disk 60, the rate of heat transfer from the electronic carrier assembly 20 is increased in several ways. One way is by reducing the thickness of the boundary layer along the top surface 40 and bottom surface 42 of the electronic carrier assembly 20. Another way is by sweeping stagnant air out of the stagnation zones, such as stagnation zone 56, between successive pairs of electronic components.

Figure 19:
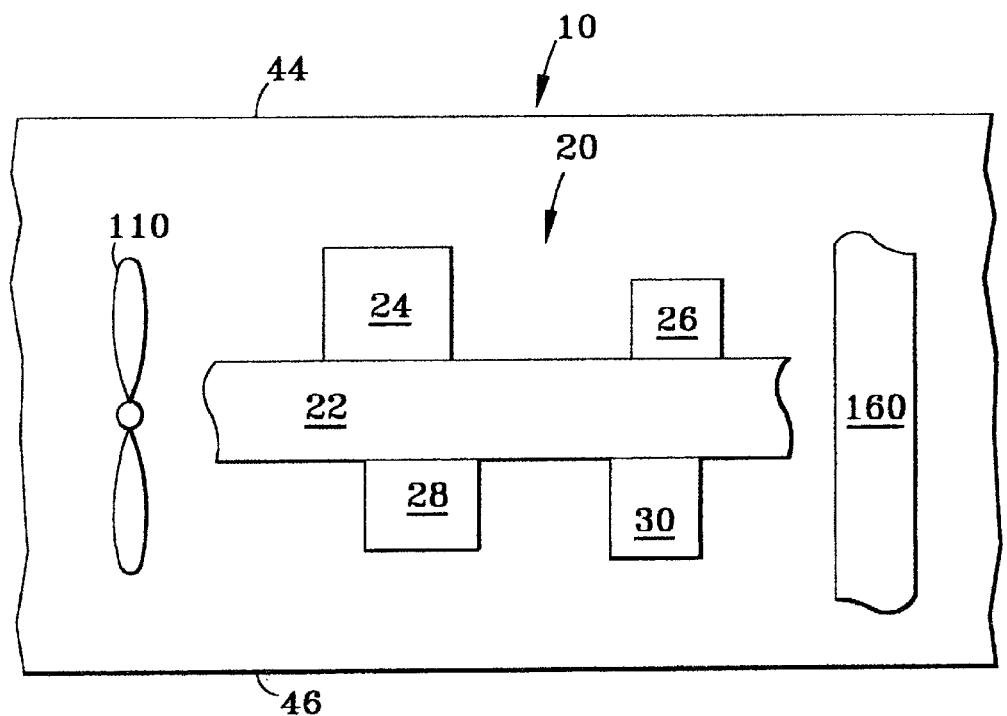
FIG. 19 depicts the electrical structure of FIG. 16, with the disk repositioned.

FIGS. 19–22 constitute modifications of FIG. 16 which illustrate various configurations of fans and rotatable disks. FIG. 19 shows FIG. 16 with rotatable disk 60 replaced by rotatable disk 160 such that the electronic carrier assembly 20 is interposed between the fan 110 and the disk 160.

Figure 20:
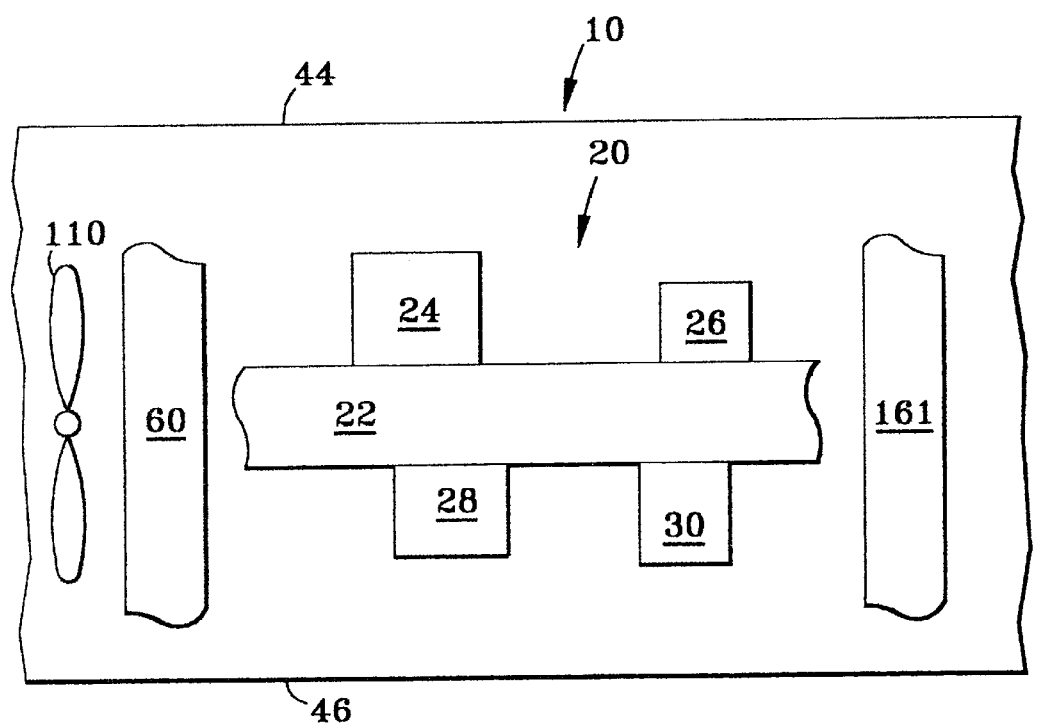
FIG. 20 depicts the electrical structure of FIG. 16, with a second rotatable disk.
Figure 21:
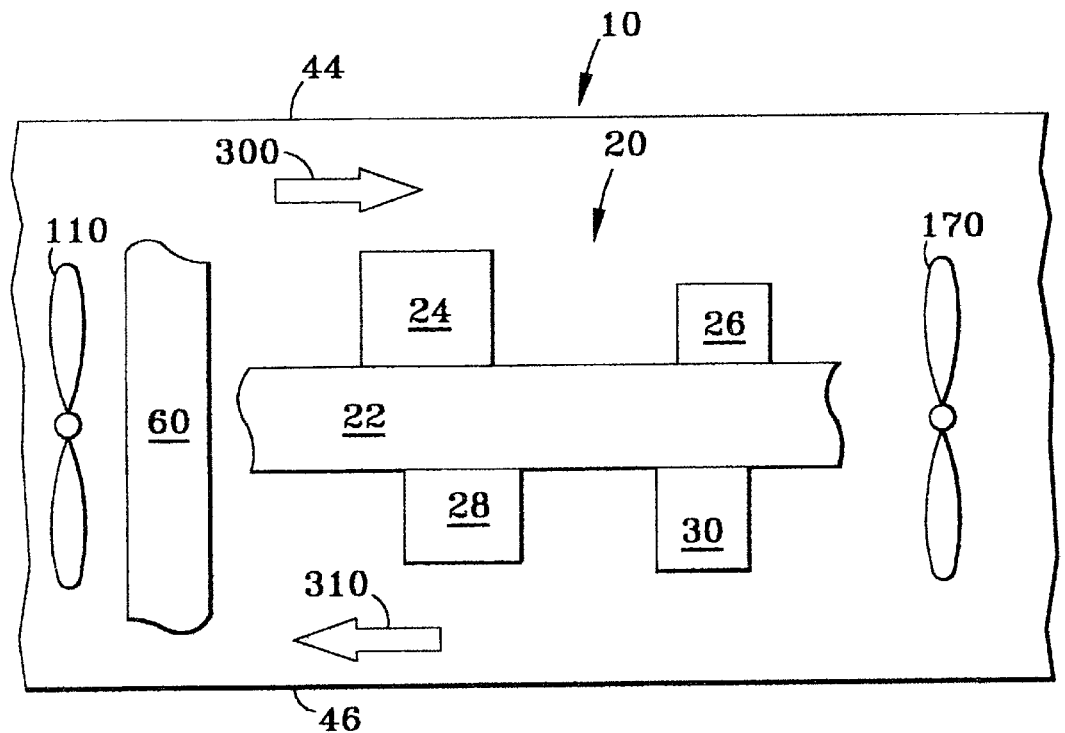
FIG. 21 depicts the electrical structure of FIG. 16, with a second fan.

FIG. 20 shows FIG. 16 with a second rotatable disk 161 positioned such that the electronic carrier assembly 20 is interposed between the rotatable disk 60 and the second rotatable disk 161. The second rotatable disk 161 has any of the features available to the disk 60. FIG. 21 shows FIG. 16 with a second fan 170 positioned such that the electronic carrier assembly 20 is interposed between the rotatable disk 60 and the fan 170. The second fan 170 has any of the features available to fan 110. The second fan 170 is for generating a second steady flow component of air circulation along a surface, such as the top surface 40, of the electronic air carrier assembly 20. If the fan 110 is a push-type fan pushing air in the direction 300, then the second fan 170 should be a pull-type fan pulling air in the direction 300. If the fan 110 is a pull-type fan pulling air in the direction 310, then the second fan 170 should be a push-type fan pushing air in the direction 310.

Figure 22:
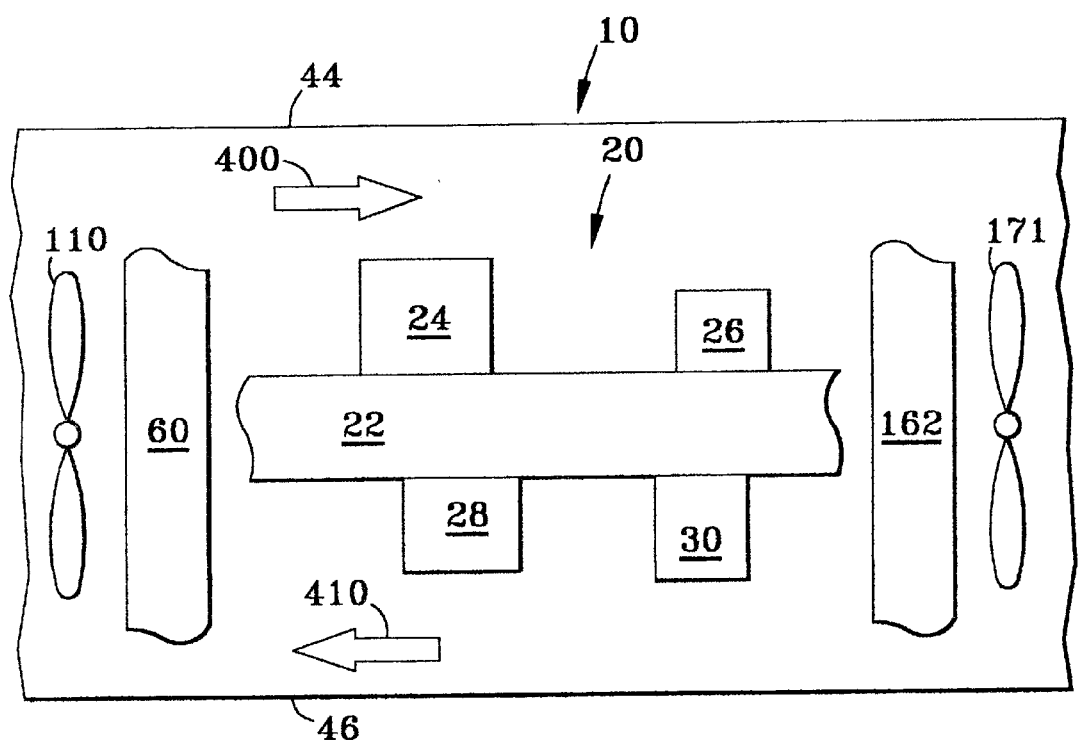
FIG. 22 depicts the electrical structure of FIG. 16, with a second fan and a second rotatable disk.
Figure 23:
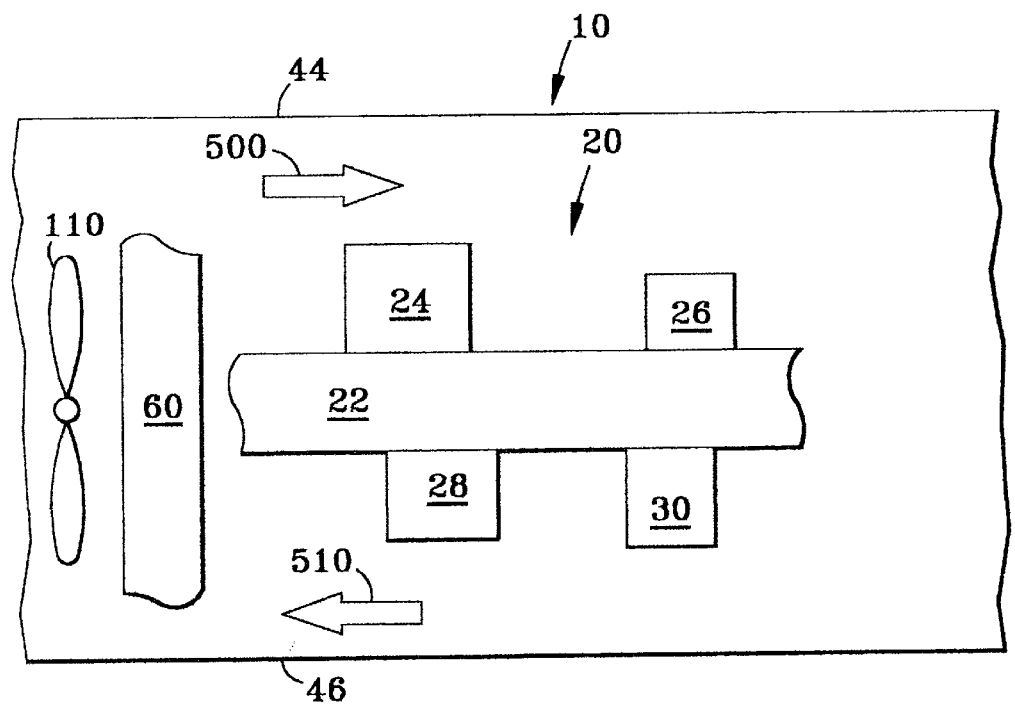
FIG. 23 depicts an open-system variant of the electrical structure of FIG. 16.
Figure 24:
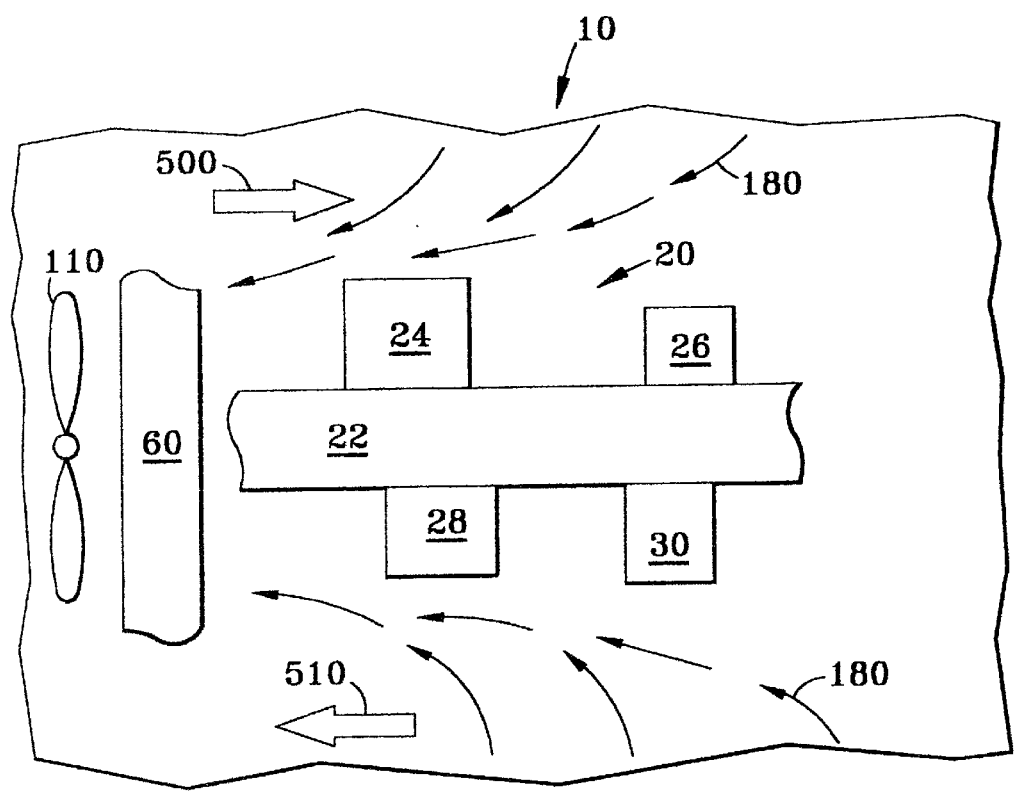
FIG. 24 depicts FIG. 23 having a pull-type fan.

FIG. 22 shows FIG. 16 with a second fan 171 and a second rotatable disk 162. The electronic carrier assembly 20 is interposed between the rotatable disk 60 and the second rotatable disk 162. The second rotatable disk 162 is interposed between the electronic carrier assembly 20 and the second fan 171. The second rotatable disk 162 has any of the features available to the disk 60. The second fan 171 has any of the features available to the fan 110. If the fan 110 is a push-type fan pushing air in the direction 400, then the second fan 171 should be a pull-type fan pulling air in the direction 400. If the fan 110 is a pull-type fan pulling air in the direction 410, then the second fan 171 should be a push-type fan pushing air in the direction 410. FIG. 23 shows FIG. 16 with lower housing surface 44 and upper housing surface 46 removed. Thus the electrical structure 10 of FIG. 23 is an open system. The fan 110 should be a push-type fan pushing air in the direction 500, since a pull-type fan would draw peripheral air from locations external to the electrical structure 10. For example, FIG. 24 illustrates FIG. 23 when the fan 110 is a pull-type fan pulling air in the direction 510. FIG. 24 shows the consequent peripheral air flow pattern 180. Note that the peripheral air flow pattern 180 is not drawn along the electrical carrier assembly 20 and is therefore not very effective in dissipating heat from the electrical carrier assembly 20. In contrast, the push-type fan 110 in FIG. 23 is capable of directing air along the electrical carrier assembly 20.

Figure 25:
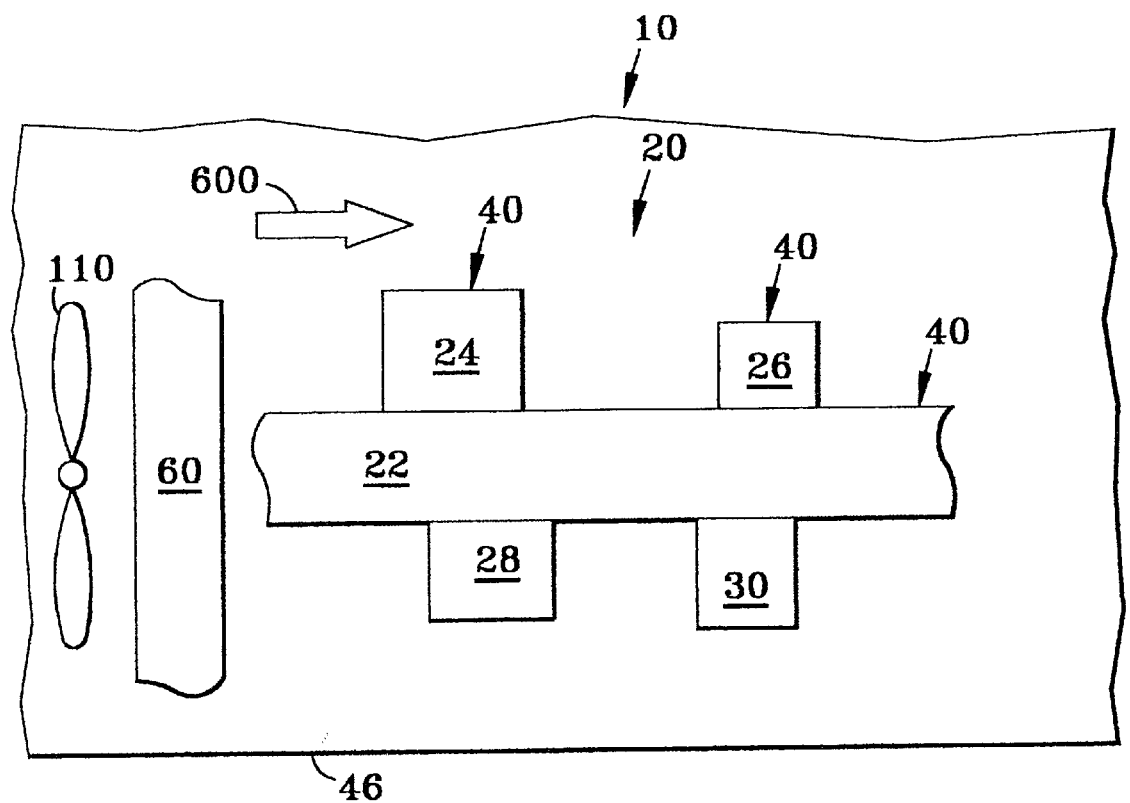
FIG. 25 depicts a partial open-system variant of the electrical structure of FIG. 16.

FIG. 25 shows FIG. 16 with upper housing surface 44 removed, such that lower housing surface 46 remains. Thus the electrical structure 10 of FIG. 23 is a partially open system. With electronic components 24 and 26 coupled to the top surface 40 of the electrical carrier assembly 20, the fan 110 should be a push-type fan pushing air in the direction 600, in order to provide effective cooling along the top surface 40 of the electrical carrier assembly 20.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method for forming a pulsating air pattern at a surface of an electronic carrier assembly, comprising:

providing the electronic carrier assembly and an electronic component coupled to the surface of the electronic carrier assembly;

providing a rotatable disk, said rotatable disk positioned such that no line normal to the surface of the electronic carrier assembly intersects said rotatable disk; and rotating the rotatable disk to form the pulsating air pattern at the surface of the electronic carrier assembly.

2. The method of claim 1, wherein the rotatable disk comprises a solid sector having a sector angle of about 180 degrees.

3. The method of claim 1, wherein the rotatable disk comprises a solid sector having a hole.

4. The method of claim 1, wherein the electronic carrier assembly is located within a closed system.

5. The method of claim 1, wherein the electronic carrier assembly is located within an open system.

6. The method of claim 1, wherein the electronic carrier assembly is vertically oriented.

7. The method of claim 1, further providing a fan for generating a steady flow component of air circulation along the surface of the electronic carrier assembly, wherein the rotating step further includes operating the fan.

8. The method of claim 7, wherein the rotatable disk is interposed between the fan and the electronic carrier assembly.

9. An electrical structure, comprising:

an electronic carrier assembly;

an electronic component coupled to a surface of the electronic carrier assembly;

a rotatable disk, said rotatable disk positioned such that no line normal to the surface of the electronic carrier assembly intersects said rotatable disk; and a system for rotating the rotatable disk, to form a pulsating air pattern at a surface of the electronic carrier assembly.

10. The electrical structure of claim 9, wherein the disk includes a solid sector having a sector angle less than 180 degrees.

11. The electrical structure of claim 9, wherein the rotatable disk includes a solid sector having a hole.

12. The electrical structure of claim 9, wherein electrical structure includes a partially open system.

13. The electrical structure of claim 9, wherein the electrical structure is vertically oriented.

14. The electrical structure of claim 9, further comprising a fan for generating a steady flow component of air circulation along the surface of the electronic carrier assembly.

15. The electrical structure of claim 14, wherein the rotatable disk is interposed between the fan and the electronic carrier assembly.

16. A method for forming a pulsating air pattern at a surface of an electronic carrier assembly, comprising:

providing a rotatable disk, wherein the rotatable disk includes a plurality of alternating solid sectors in an alternating pattern with void sectors; and rotating the rotatable disk to form the pulsating air pattern at the surface of the electronic carrier assembly.

17. A method for forming a pulsating air pattern at a surface of an electronic carrier assembly, comprising:

providing a first rotatable disk and a second rotatable disk, wherein the electronic carrier assembly is interposed between the first rotatable disk and the second rotatable disk; and rotating the first rotatable disk and the second rotatable disk to form the pulsating air pattern at the surface of the electronic carrier assembly.

18. A method for forming a pulsating air pattern at a surface of an electronic carrier assembly, comprising:

providing a fan and a rotatable disk, wherein the electronic carrier assembly is interposed between the fan and the rotatable disk;

operating the fan to generate a steady flow component of air circulation along the surface of the electronic carrier assembly; and rotating the rotatable disk to form the pulsating air pattern at the surface of the electronic carrier assembly.

19. A method for forming a pulsating air pattern at a surface of an electronic carrier assembly, comprising:

providing a first fan, a rotatable disk, and a second fan, wherein the rotatable disk is interposed between the first fan and the electronic carrier assembly, and wherein the electronic carrier assembly is interposed between the rotatable disk and the second fan;

operating the first fan and the second fan to generate a steady flow component of air circulation along the surface of the electronic carrier assembly; and rotating the rotatable disk to form the pulsating air pattern at the surface of the electronic carrier assembly.

20. The method of claim 19, further providing a second rotatable disk, wherein the second rotatable disk is interposed between the second fan and the electronic carrier assembly, and wherein the rotating step further includes rotating the second rotatable disk.

21. An electrical structure, comprising:

an electronic carrier assembly;

a rotatable disk, wherein the rotatable disk includes a plurality of solid sectors in an alternating pattern with void sectors; and a system for rotating the rotatable disk, to form a pulsating air pattern at a surface of the electronic carrier assembly.

22. An electrical structure, comprising:

an electronic carrier assembly;

a rotatable disk, wherein the rotatable disk includes a solid polygon having a hole; and a system for rotating the rotatable disk, to form a pulsating air pattern at a surface of the electronic carrier assembly.

23. An electrical structure, comprising:

an electronic carrier assembly;

a first rotatable disk and a second rotatable disk, wherein the electronic carrier assembly is interposed between the first rotatable disk and the second rotatable disk; and a system for rotating the first rotatable disk and the second rotatable disk, to form a pulsating air pattern at a surface of the electronic carrier assembly.

24. An electrical structure, comprising:

an electronic carrier assembly;

a fan for generating a steady flow component of air circulation along a surface of the electronic carrier assembly;

a rotatable disk, wherein the electronic carrier assembly is interposed between the fan and the rotatable disk; and a system for rotating the rotatable disk, to form a pulsating air pattern at a surface of the electronic carrier assembly.

25. An electrical structure, comprising:

an electronic carrier assembly;

a first fan and a second fan, for generating a steady flow component of air circulation along a surface of the electronic carrier assembly;

a rotatable disk, wherein the rotatable disk is interposed between the first fan and the electronic carrier assembly, and wherein the electronic carrier assembly is interposed between the rotatable disk and the second fan; and a system for rotating the rotatable disk, to form a pulsating air pattern at a surface of the electronic carrier assembly.

26. The electrical structure of claim 36, further comprising:

a second rotatable disk interposed between the electronic carrier assembly and the second fan; and a system for rotating the second rotatable disk.

* * * * *

UNITED STATES PATENT AND TRADEMARK OFFICE
CERTIFICATE OF CORRECTION

PATENT NO. : 6,219,234 B1
DATED : April 17, 2001
INVENTOR(S) : Sammakia et al.

It is certified that error appears in the above-identified patent and that said Letters Patent is hereby corrected as shown below:

Column 12,
Line 25, should read -- The electrical structure of claim 25[36], further comprising: --

Signed and Sealed this

Twenty-seventh Day of November, 2001

Attest:

NICHOLAS P. GODICI
Attesting Officer    Acting Director of the United States Patent and Trademark Office